United States Patent
Wang et al.

(10) Patent No.: US 12,069,955 B2
(45) Date of Patent: Aug. 20, 2024

(54) MAGNETORESISTANCE RANDOM ACCESS MEMORY DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Si-Han Tsai, Taichung (TW); Ching-Hua Hsu, Kaohsiung (TW); Chen-Yi Weng, New Taipei (TW); Po-Kai Hsu, Tainan (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 557 days.

(21) Appl. No.: 17/363,023

(22) Filed: Jun. 30, 2021

(65) Prior Publication Data
US 2022/0393103 A1    Dec. 8, 2022

(30) Foreign Application Priority Data
Jun. 2, 2021 (CN) .......................... 202110613064.9

(51) Int. Cl.
*H10N 50/01* (2023.01)
*H10B 61/00* (2023.01)
*H10N 50/80* (2023.01)
*H10N 50/85* (2023.01)

(52) U.S. Cl.
CPC ............. *H10N 50/01* (2023.02); *H10B 61/00* (2023.02); *H10N 50/80* (2023.02); *H10N 50/85* (2023.02)

(58) Field of Classification Search
CPC ......... H10N 50/01; H10N 50/80; H10B 61/00
USPC ....................................................... 257/421
See application file for complete search history.

(56) References Cited

U.S. PATENT DOCUMENTS

| | | | |
|---|---|---|---|
| 9,558,929 B2 * | 1/2017 | Redepenning | .... H01L 21/02282 |
| 2021/0020693 A1 * | 1/2021 | Kuo | ....................... H10N 50/10 |
| 2021/0288107 A1 * | 9/2021 | Kuo | ....................... H10N 50/10 |

* cited by examiner

*Primary Examiner* — Jami Valentine Miller
(74) *Attorney, Agent, or Firm* — Winston Hsu

(57) ABSTRACT

A method for fabricating a magnetic random access memory (MRAM) device includes the steps of first forming a first magnetic tunneling junction (MTJ) on a substrate, forming a first top electrode on the first MTJ, and then forming a passivation layer around the first MTJ. Preferably, the passivation layer includes a V-shape and a valley point of the V-shape is higher than a top surface of the first top electrode.

11 Claims, 3 Drawing Sheets

MAGNETORESISTANCE RANDOM ACCESS MEMORY DEVICE AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a magnetic random access memory (MRAM) device includes the steps of first forming a first magnetic tunneling junction (MTJ) on a substrate, forming a first top electrode on the first MTJ, and then forming a passivation layer around the first MTJ. Preferably, the passivation layer includes a V-shape and a valley point of the V-shape is higher than a top surface of the first top electrode.

According to another aspect of the present invention, a magnetic random access memory (MRAM) device includes a first magnetic tunneling junction (MTJ) on a substrate, a first top electrode on the first MTJ, and a passivation layer around the first MTJ. Preferably, the passivation layer includes a V-shape and a valley point of the V-shape is higher than a top surface of the first top electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
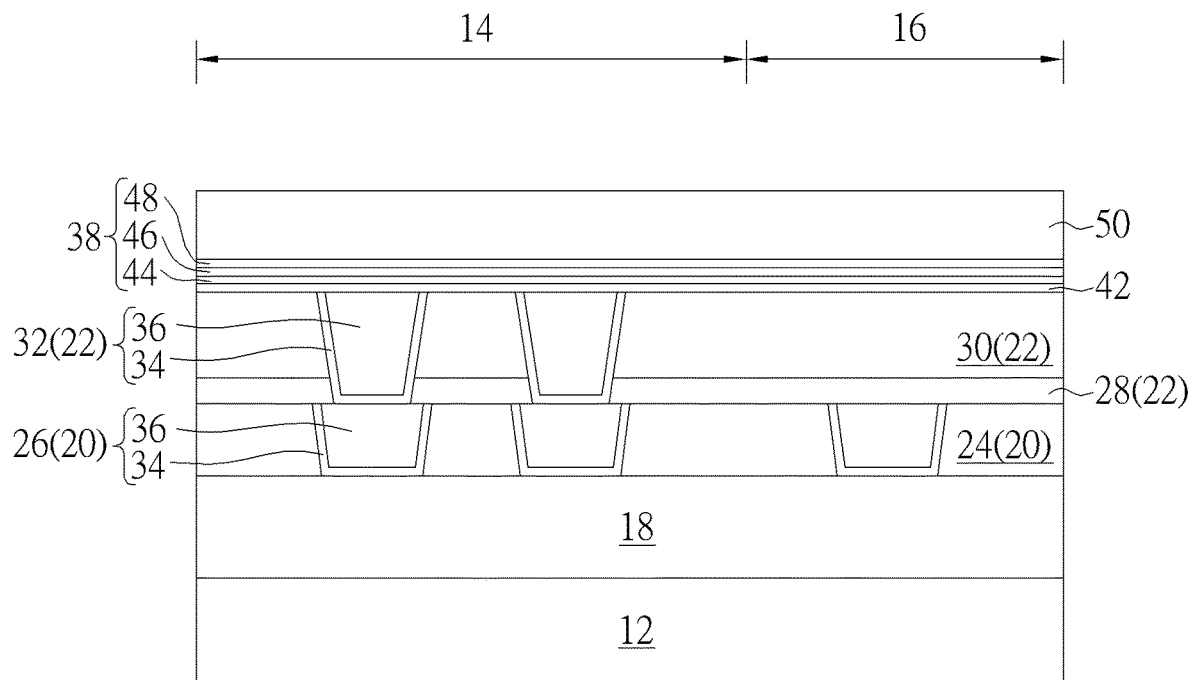
FIGS. 1-6 illustrate a method for fabricating a MRAM device according to an embodiment of the present invention.

Referring to FIGS. 1-6, FIGS. 1-6 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
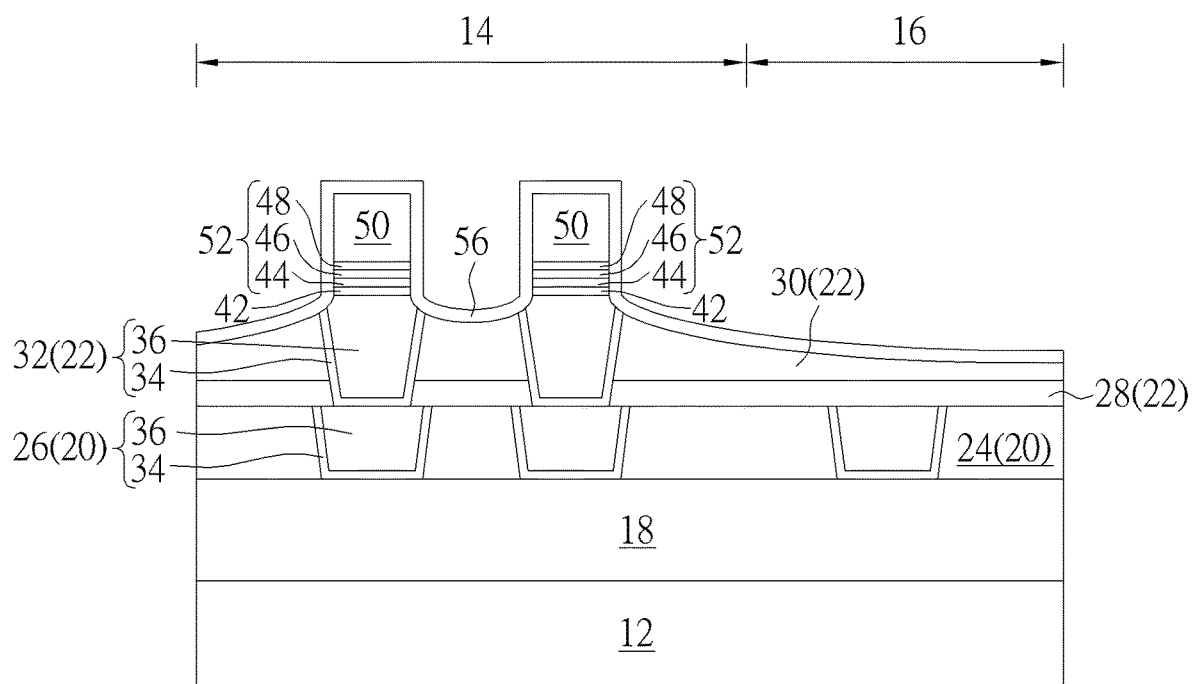

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
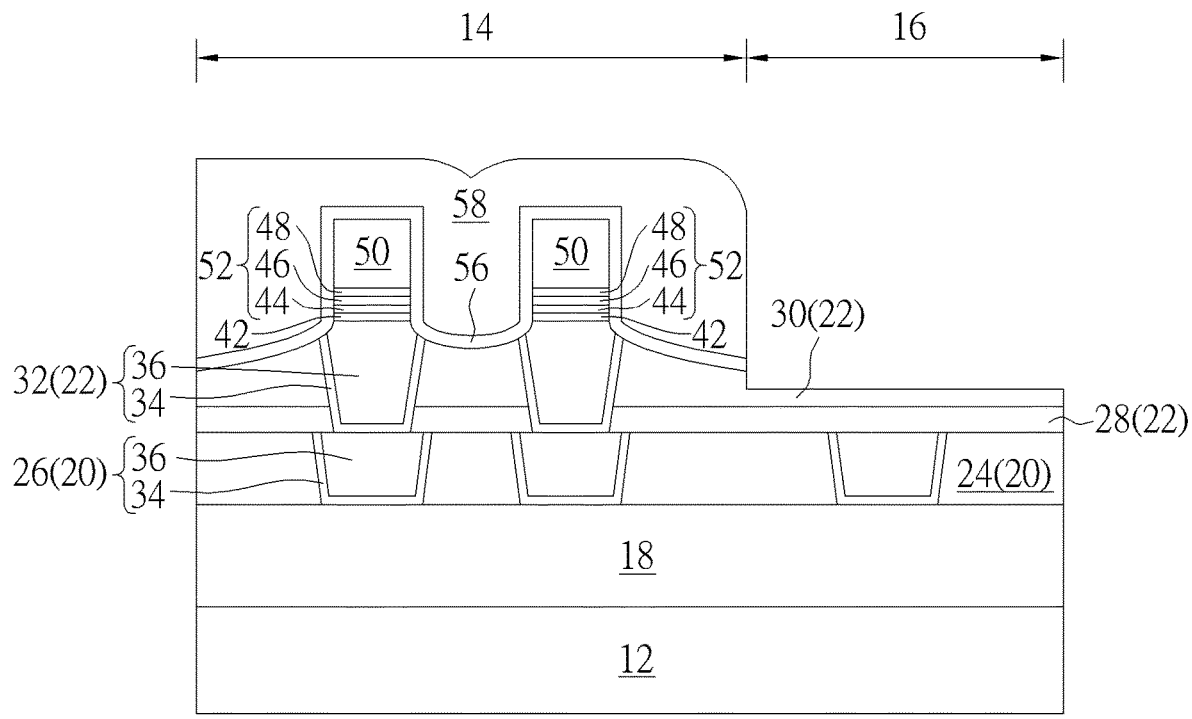

Next, as shown in FIG. 3, an atomic layer deposition (ALD) process is conducted to form a passivation layer 58 covering the MTJs 52 and the IMD layer 30 on the logic region 16, an etching back process is conducted to remove part of the passivation layer 58 on the MRAM region 14 and logic region 16 for forming a V-shape on the top surface of the passivation layer 58 between the two electrodes 50, and then another photo-etching process is conducted to remove the passivation layer 58, the cap layer 56, and part of the IMD layer 30 on the logic region 16. In this embodiment, the passivation layer 58 preferably includes silicon oxide, but not limited thereto.

It should be noted that after using the aforementioned etching process to remove part of the passivation layer 58, the top surface of the remaining passivation layer 58 is still slightly higher than the top surface of the two top electrodes 50 at a distance about 300-500 Angstroms and a V-shape is also formed on the top surface of the passivation layer 58 on the MRAM region 14 at the same time, in which the V-shape is between the two top electrodes 50, the valley point of the V-shape is higher than the top surface of the top electrodes, and the angle of the V-shape is greater than 110 degrees or more preferably greater than 120 degrees.

Figure 4:
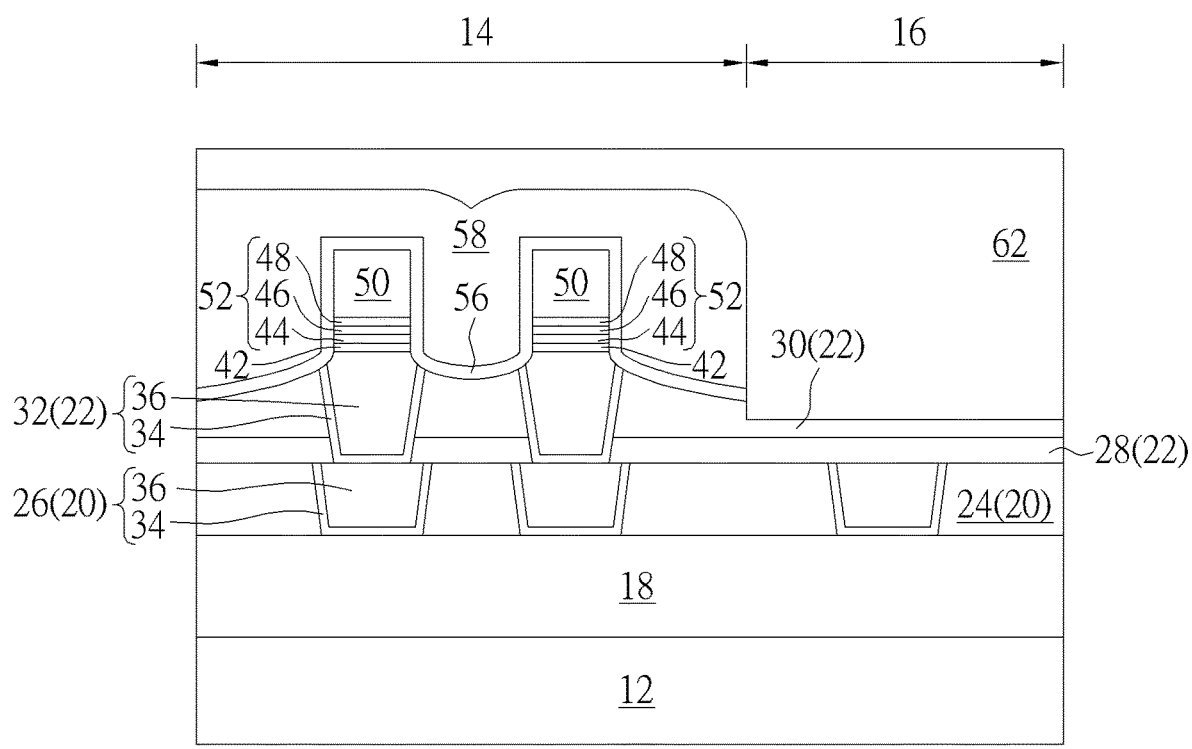

Next, as shown in FIG. 4, a flowable chemical vapor deposition (FCVD) process is conducted to form an intermetal dielectric (IMD) layer 62 on the passivation layer 58, and a planarizing process such as chemical mechanical polishing (CMP) is conducted to remove part of the IMD layer 62 on the MRAM region 14 and logic region 16 so that the top surface of the IMD layer 62 on the MRAM region 14 is even with the top surface of the IMD layer 62 on the logic region 16. In this embodiment, the IMD layer 62 preferably include an ultra low-k (ULK) dielectric layer including but not limited to for example porous material or silicon oxycarbide (SiOC) or carbon doped silicon oxide (SiOCH).

Figure 5:
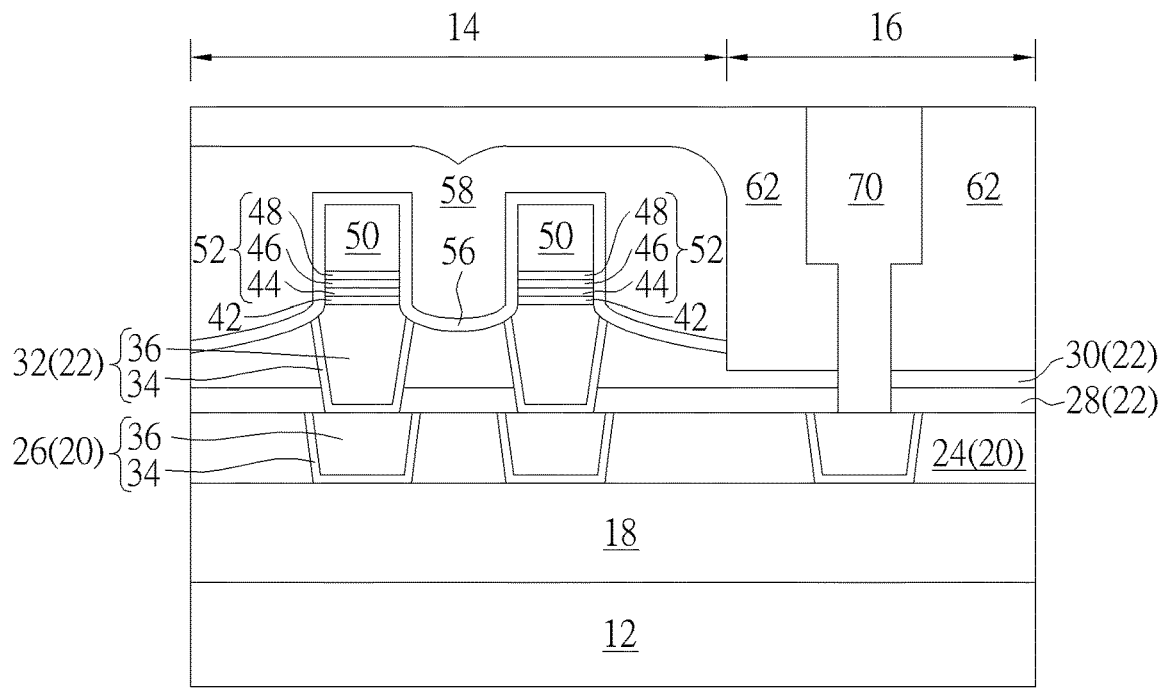

Next, as shown in FIG. 5, a pattern transfer process is conducted by using a patterned mask (not shown) to remove part of the IMD layer 62, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 6:
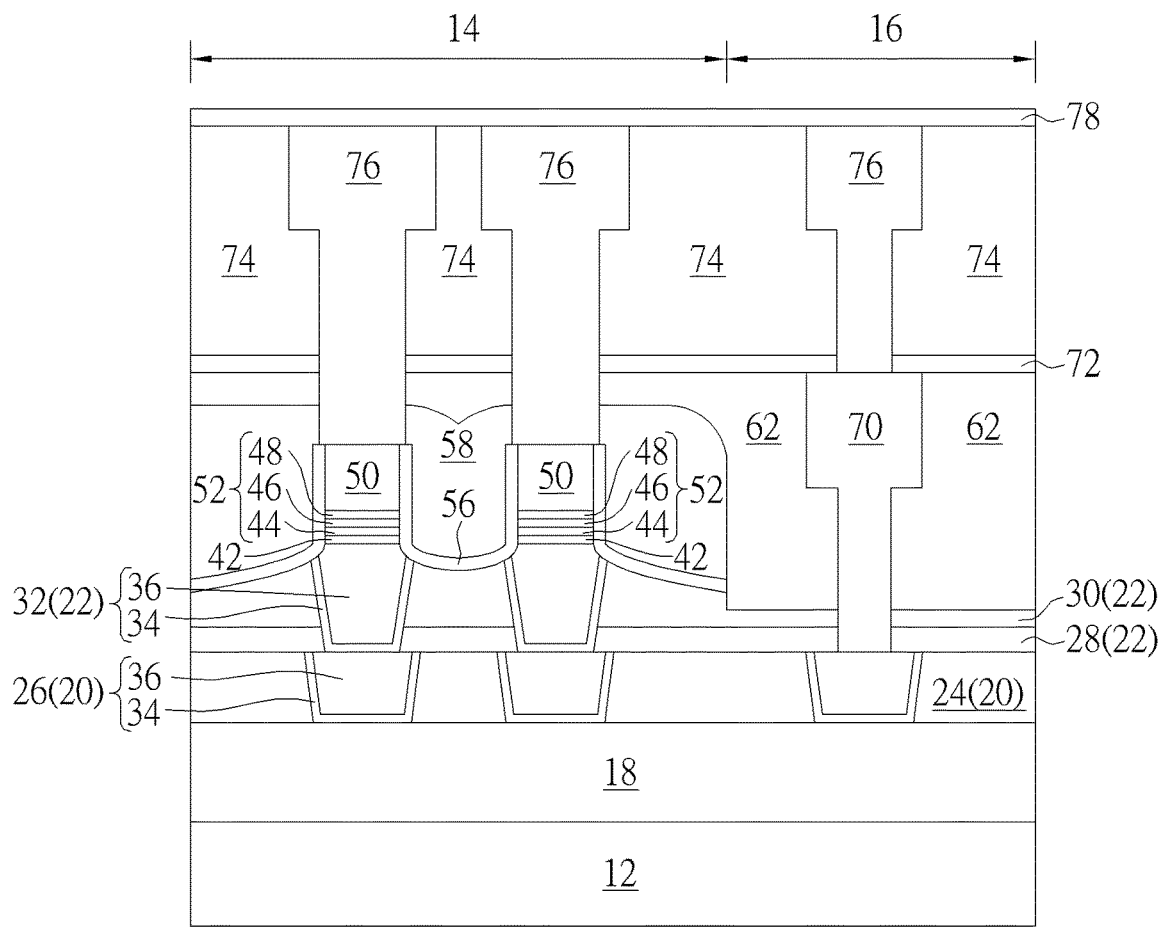

Next, as shown in FIG. 6, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, and part of the IMD layer 62 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 6, FIG. 6 further illustrates a structural view of a semiconductor device according to an embodiment of the present invention. As shown in FIG. 6, the semiconductor device includes a plurality of MTJs 52 on the MRAM region 14, a top electrode 50 disposed on each of the MTJs 52, a cap layer 56 disposed on sidewalls of the MTJs 52 and top electrodes 50, a passivation layer 58 around the MTJs 52, an IMD layer 62 disposed on the passivation layer 58, a stop layer 72 disposed on the IMD layer 62, another IMD layer 74 disposed on the stop layer 72, and metal interconnections 76 disposed in the IMD layer 74, stop layer 72, IMD layer 62, and passivation layer 58 to directly contact the top electrodes 50. Viewing from a more detailed perspective, the top surface of the top electrode 50 is even with the top surface of the cap layer 56, the top surface of the passivation layer 58 includes a V-shape, the V-shape is between the two MTJs 52 and the two top electrodes 50, the valley point of the V-shape is higher than the top surfaces of the top electrodes 50 and cap layer 56 and the bottom surface of the metal interconnection 76, and the angle of the V-shape is greater than 110 degrees or more preferably greater than 120 degrees. It should be noted that the passivation layer 58 is only disposed on the MRAM region 14 without extending to the logic region 16 while the IMD layer 62 adjacent to the passivation layer 58 not only contacts the lower level IMD layer 30 directly but also extends from the logic region 16 to the top surface of the passivation layer 58 on the MRAM region 14.

Overall, the present invention first forms a passivation layer on the MTJ and then selectively using an etching process to remove part of the passivation layer so that the top surface of the passivation layer between two adjacent MTJs forms a V-shape. Since the stacked passivation layer is much higher than the top surface of the top electrodes, it would be desirable to form a shallow V-shape profile greater than 110 degrees on the top surface of the passivation layer between two adjacent MTJs or top electrodes as part of the passivation layer is removed by an etching process while the valley point of the V-shape is higher than top surface of the top electrodes. According to a preferred embodiment of the present invention, by forming the valley point of the V-shape including the top surface of the passivation layer on two adjacent sides above the top surface of the top electrodes at a distance could prevent etching process conducted afterwards for forming the upper level metal interconnections from over-etching the cap layer and passivation layer adjacent to two sides of the top electrodes and affecting the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a magnetic random access memory (MRAM) device, comprising:

forming a first magnetic tunneling junction (MTJ) on a substrate;
    forming a first top electrode on the first MTJ;
    forming a passivation layer around the first MTJ; and
    performing an etching back process to remove part of the passivation layer for forming a V-shape, wherein a valley point of the V-shape is higher than a top surface of the first top electrode.

2. The method of claim 1, further comprising:

forming a first inter-metal dielectric (IMD) layer on the substrate;
    forming a first metal interconnection and a second metal interconnection in the first IMD layer;
    forming the first MTJ on the first metal interconnection and a second MTJ on the second metal interconnection;
    forming the first top electrode on the first MTJ and a second top electrode on the second MTJ;
    forming a cap layer on the first MTJ and the second MTJ;
    forming the passivation layer on the cap layer;
    removing part of the passivation layer, part of the cap layer, and part of the first IMD layer;
    forming a second IMD layer on the passivation layer; and
    forming a third metal interconnection and a fourth metal interconnection in the second IMD layer to connect the first top electrode and the second top electrode.

3. The method of claim 2, wherein the V-shape is between the first top electrode and the second top electrode.

4. The method of claim 2, wherein the valley point of the V-shape is higher than a bottom surface of the third metal interconnection.

5. The method of claim 2, wherein top surfaces of the first top electrode and the cap layer are coplanar.

6. The method of claim 1, wherein an angle of the V-shape is greater than 110 degrees.

7. A magnetic random access memory (MRAM) device, comprising:

a first magnetic tunneling junction (MTJ) on a substrate;
    a first top electrode on the first MTJ;
    a cap layer adjacent to the first MTJ and the first top electrode; and
    a passivation layer around the first MTJ, wherein the passivation layer comprises a V-shape, a valley point of the V-shape is higher than a top surface of the cap layer, and an angle of the V-shape is greater than 110 degrees.

8. The MRAM device of claim 7, further comprising:

a first inter-metal dielectric (IMD) layer on the substrate;
    a first metal interconnection and a second metal interconnection in the first IMD layer;
    the first MTJ on the first metal interconnection and a second MTJ on the second metal interconnection;
    the first top electrode on the first MTJ and a second top electrode on the second MTJ;
    the cap layer adjacent to the first MTJ and the second MTJ;
    the passivation layer on the cap layer;
    a second IMD layer on the passivation layer; and
    a third metal interconnection and a fourth metal interconnection in the second IMD layer to connect the first top electrode and the second top electrode.

9. The MRAM device of claim 8, wherein the V-shape is between the first top electrode and the second top electrode.

10. The MRAM device of claim 8, wherein the valley point of the V-shape is higher than a bottom surface of the third metal interconnection.

11. The MRAM device of claim 8, wherein top surfaces of the top electrode and the cap layer are coplanar.

* * * * *